April 26, 1966 R. J. REINTGEN 3,248,681

CONTACTS FOR SEMICONDUCTOR DEVICES

Filed March 30, 1962

WITNESSES

INVENTOR
Robert J. Reintgen
BY
ATTORNEY

United States Patent Office 3,248,681
Patented Apr. 26, 1966

3,248,681

CONTACTS FOR SEMICONDUCTOR DEVICES

Robert J. Reintgen, Latrobe, Pa., assignor to Westinghouse Electric Corporation, East Pittsburgh, Pa., a corporation of Pennsylvania Filed Mar. 30, 1962, Ser. No. 183,789
5 Claims. (Cl. 338—276)

The present invention relates to a composite metallic base contact member for a semiconductor device.

Heretofore in the prior art, problems have arisen in mounting semiconductor wafers to conductive base members. The usual main criteria for selecting a base member has been based on high electrical and thermal conductivity. However, during the mounting of the semiconductor, imperfections occurred in the wafer because of mechanical strains produced during the thermal cycling process instrumental in forming the bond to the conductive base. The metals usually employed for the base member, such as copper, copper base alloys or brass, have a thermal expansion about twice that of germanium and about four times that of silicon. Therefore, during the soldering operation strain is introduced into the wafer, usually in the cooling cycle. The base contracts to a substantially greater extent than the semiconductor in cooling from the freezing temperature of the bonding material to room or operating temperature so that the wafer is placed under substantial compression at room temperature. The problem was partially alleviated by employing a base member composed of a nickel-cobalt-iron alloy, selling under the trade name Kovar, for contacts to silicon wafers since the coefficient of expansion of Kovar alloy is substantially the same as that of silicon. Accordingly, much of the strain introduced during cooling is eliminated. However, while the metal Kovar has the desired matching thermal coefficient of expansion of the silicon wafer, it does not have the required thermal conductivity necessary to insure efficient operation in semiconductor devices.

The object of the present invention is to provide a semiconductor device comprising a semiconductor element and at least one composite metallic base member having two or more metal layers, bonded to the element, the metal layer nearest the semiconductor element having a thermal coefficient of expansion of about the same value as that of the element, the second metal layer having a relatively high thermal conductivity.

Other objects of the invention will, in part, be obvious and will in part, appear hereinafter.

Figure 1:
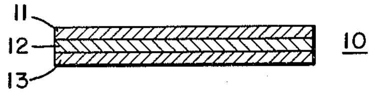
Figure 2:
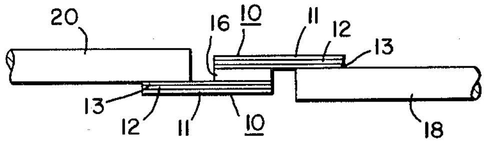

In order to more fully understand the nature and objects of the invention, reference should be had to the following detailed description and drawings of which:

FIGURE 1 is an elevation view in cross-section of a composite metallic base member for a semiconductor device; and FIGURE 2 is a semiconductor device employing the base member of the invention.

In accordance with the present invention and in attainment of the foregoing objects there is provided a semiconductor device comprising, in combination, a semiconductor element, such as silicon or germanium, and one or more composite metallic base members comprising two or more metallic layers, bonded to the element. It is preferred that the base member contains three metal layers, two of which are composed of similar metals in order to suppress the bi-metal effect of bowing and the like. The outer metal layers should have a thermal coefficient of expansion of substantially the same value as that of the semiconductor element over the temperature range to which the combination is subjected in manufacture and use and the inner layer should have a relatively high thermal conductivity. A particularly advantageous composition for the outer layers of the base member for a germanium wafer includes an alloy composed of about 56% iron, 43.5% nickel, and .6% manganese. This material has a coefficient of expansion at 20° C. of $6.3\times10^{-6}$ per degree centigrade as compared with $6.2\times10^{-6}$ per degree centigrade for germanium. Copper or silver or base alloys thereof may be employed to provide the inner layer of the base member since these materials are known to have rapid heat dissipating properties.

A particularly advantageous composition for the outer layers of the base member for a silicon wafer includes the alloy Kovar comprising from 28% to 34% nickel, from 5% to 25% cobalt, less than 1% manganese and the remainder iron. The nominal composition of this alloy is 29% nickel, 17.5% cobalt, 0.8% manganese and the balance iron. The coefficient of expansion for Kovar alloy at 20° C. is about $4\times10^{-6}$ per degree centigrade while the same for silicon ranges between 2 and $4\times10^{-6}$ per degree centigrade. Similarly, a metal such as copper or silver or base alloys thereof may be employed for the inner layer.

In selecting the ratios of the metal thicknesses of the metal layers Kovar alloy and silver, for example, it is necessary to maintain enough material strength to insure that the shear stresses are confined at the Kovar alloy, silver interface, and nowhere else in the contact material. For example, each of the layers may be from 2 to 4 mils in thickness, however, it is preferred that all of the layers be equal in thickness and that the overall thickness of the base member be about 10 mils for semi-conductor wafers having a thickness of from 7 to 10 mils. However, base members having a thickness greater than 10 mils have been found satisfactory.

By employing a composite metallic base member, substantially strain free junctions are obtained between germanium and base members whose outer layers have expansion coefficients from about $5\times10^{-6}$ to $8\times10^{-6}$ per degree centigrade and between silicon and base members whose outer layers have coefficients of expansion in the temperature range of from $2\times10^{-6}$ to $4\times10^{-6}$ per degree centigrade along with the requisite high thermal conductivity provided by the inner metal layer of the composite base member. Other metals and alloys having substantially the same thermal coefficients of expansion as silicon and germanium may be employed as the outer metal layers of the composite member, however, the alloys employed herein are the most feasible when considering the overall cost of the semiconductor device.

Referring to FIG. 1, a composite metal member 10 may be produced by stacking individual sheets of a metal or alloy of the desired thicknesses and rolling the combination under heat and pressure under proper control so that layers 11, 12 and 13 obtain a sandwich like configuration while each retains its metal or alloy identity. The outer surfaces of layers 11 and 13 may be coated with a suitable metal in order to facilitate the joining of the member 10 to a semiconductor member and to electrical leads.

With reference to FIG. 2, there is shown a semiconductor device in which two composite metal members 10 are joined to each surface of a semiconductor wafer 16 with electrically and thermally conductive leads 18 and 20 joined to the members 10 on the same surface as the semiconductor member to connect the combination in some type of an electrical circuit.

It should be appreciated that while the outer layers of, for example, Kovar alloy does not have good thermal conductivity, the heat from the semiconductor member is dissipated through the Kovar alloy to the inner layer of, for example, silver at one end of the composite member and then is rapidly dissipated transversely to the other end of the composite member to a conductive lead joined to the same surface of the composite member as the semiconductor member.

Furthermore, the employment of two outer metal layers on an inner metal layer suppresses bowing or bending or other bi-metallic effects when the composite member is subjected to heat.

The following example is illustrative of the teachings of the invention.

A composite metal base member as is shown in FIG. 1, was prepared by disposing between two metal sheets of Kovar alloy a sheet of the metal silver. Each of the sheets was of the order of 5 mils in thickness. The combination was rolled under heat and pressure so that a metallurgical bond was formed between the Kovar layers and the silver layer, each layer retaining its original identity. The total thickness of the member was about 10 mils, each of the individual layers being equal in thickness. The outer surfaces of the Kovar layer were clad with gold to a thickness of about .0003 inch. The composite members were then disposed on each surface of a silicon wafer, a portion of each member extending beyond the edge of the wafer. Electrically conductive leads were then disposed on the inner surface of each composite member and the combination was placed in a jig to hold all the components in situ. The combination was then placed in a furnace at a sufficient degree of heat to form a bond between the silicon wafer and the composite members and between the composite members and the electrical leads. Thereafter the device was coated with an epoxy resin and cured so as to provide a hermetic enclosure for the silicon wafer.

It is intended that the foregoing description and drawings be interpreted as illustrative and not limiting.

I claim as my invention:

1. A semiconductor device comprising, in combination, a semiconductor element selected from the group consisting of silicon and germanium and at least one relatively flat composite metallic base member comprising at least three metal layers of at least two different metals, the composite base member bonded to the element at one flat face and the base member having a portion extending laterally beyond the semiconductor element, the outer metal layers of the member having a thermal coefficient of expansion of about the same value as that of the element, the inner metal layer having a relatively high thermal conductivity so that heat is readily dissipated longitudinally through the member to the laterally extending portion.

2. A semiconductor device comprising, in combination, a silicon semiconductor element and at least one composite metallic base member bonded to the element, the member comprising two outer layers of 2 to 4 mils in thickness of an alloy comprising 28% to 34% nickel, 5% to 25% cobalt, less than 1% manganese and the remainder iron and an inner layer of at least one metal selected from the group consisting of copper, copper base alloys, silver and silver base alloys, of 2 to 4 mils in thickness.

3. A semiconductor device comprising, in combination, a silicon semiconductor element and at least one relatively flat composite metallic base member bonded to the element, at one flat face and the base member having a portion extending laterally beyond the semiconductor element, the member comprising two outer layers of about 3.3 mils in thickness of an alloy comprising about 29% nickel, 17.5% cobalt, 0.8% manganese and the balance iron and an inner layer of silver, of about 3.3 mils in thickness so that heat is readily dissipated longitudinally through the member to the laterally extending portion.

4. A semiconductor device comprising a silicon semiconductor element, two relatively flat composite metallic base members bonded to the element, at one flat face and the base member having a portion extending laterally beyond the semiconductor element, the members comprising two outer layers of about 3.3 mils in thickness of an alloy comprising 29% nickel, 17.5% cobalt, 0.8% manganese and the balance iron and an inner layer of silver of about 3.3 mils in thickness so that heat is readily dissipated longitudinally through the member to the laterally extending portion, external electrically and thermally conductive leads joined to the composite base members and a hermetic insulating enclosure for the semiconductor element.

5. A relatively flat, composite metallic base member suitable for use in a semiconductor device as a contact member for a semiconductor element, the member comprising two outer layers of 2 to 4 mils in thickness of an alloy comprising 28% to 34% nickel, 5% to 25% cobalt, less than 1% manganese and the remainder iron and an inner layer of at least one metal selected from the group consisting of copper, copper base alloys, silver and silver base alloys, of 2 to 4 mils in thickness, the member being capable of dissipating heat rapidly in a longitudinal direction.

References Cited by the Examiner

UNITED STATES PATENTS

| | | | |
|---|---|---|---|
| 2,946,935 | 6/1960 | Finn | 317—234 |
| 3,002,133 | 9/1961 | Maiden et al. | 317—234 |
| 3,010,057 | 11/1961 | Albert | 317—234 |

DAVID J. GALVIN, *Primary Examiner.*

J. A. ATKINS, *Assistant Examiner.*